United States Patent
Domino

(10) Patent No.: US 11,979,178 B2
(45) Date of Patent: May 7, 2024

(54) CIRCUITS, DEVICES AND METHODS RELATED TO IMPEDANCE TUNERS

(71) Applicant: SKYWORKS SOLUTIONS, INC., Irvine, CA (US)

(72) Inventor: William J. Domino, Yorba Linda, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/868,551

(22) Filed: Jul. 19, 2022

(65) Prior Publication Data
US 2023/0017268 A1    Jan. 19, 2023

Related U.S. Application Data

(63) Continuation of application No. 16/986,814, filed on Aug. 6, 2020, now Pat. No. 11,394,410.

(60) Provisional application No. 62/884,146, filed on Aug. 7, 2019.

(51) Int. Cl.
| H04B 1/04 | (2006.01) |
| H03H 7/38 | (2006.01) |
| H03H 7/40 | (2006.01) |
| H03J 5/24 | (2006.01) |
| H04B 1/18 | (2006.01) |

(52) U.S. Cl.
CPC ............ *H04B 1/0458* (2013.01); *H03H 7/40* (2013.01); *H03J 5/24* (2013.01); *H04B 1/18* (2013.01); *H03J 2200/06* (2013.01)

(58) Field of Classification Search
None
See application file for complete search history.

(56) References Cited

U.S. PATENT DOCUMENTS 11,394,410 B2 *  7/2022  Domino ................... H03J 5/24

* cited by examiner

*Primary Examiner* — Kenneth B Wells
(74) *Attorney, Agent, or Firm* — Chang & Hale LLP

(57) ABSTRACT

Circuits, devices and methods related to impedance tuners. In some embodiments, a capless impedance tuner can include first node and second nodes, a first series path, a second series path, and an inductance path, each between the first node and the second node and including a switch to allow the path to couple or uncouple the first and second nodes. Each series path can be configured to allow a substantially continuous flow of a direct current between the first node and the second node when coupled. The tuner can further include a shunt path with a switch to allow coupling or uncoupling of the second node and ground. The tuner can further include a switchable grounding path implemented along the inductance path and configured to allow the inductance path to function as a series inductance path between the first and second nodes, or as a shunt inductance path between the ground and a node along the inductance path.

15 Claims, 13 Drawing Sheets

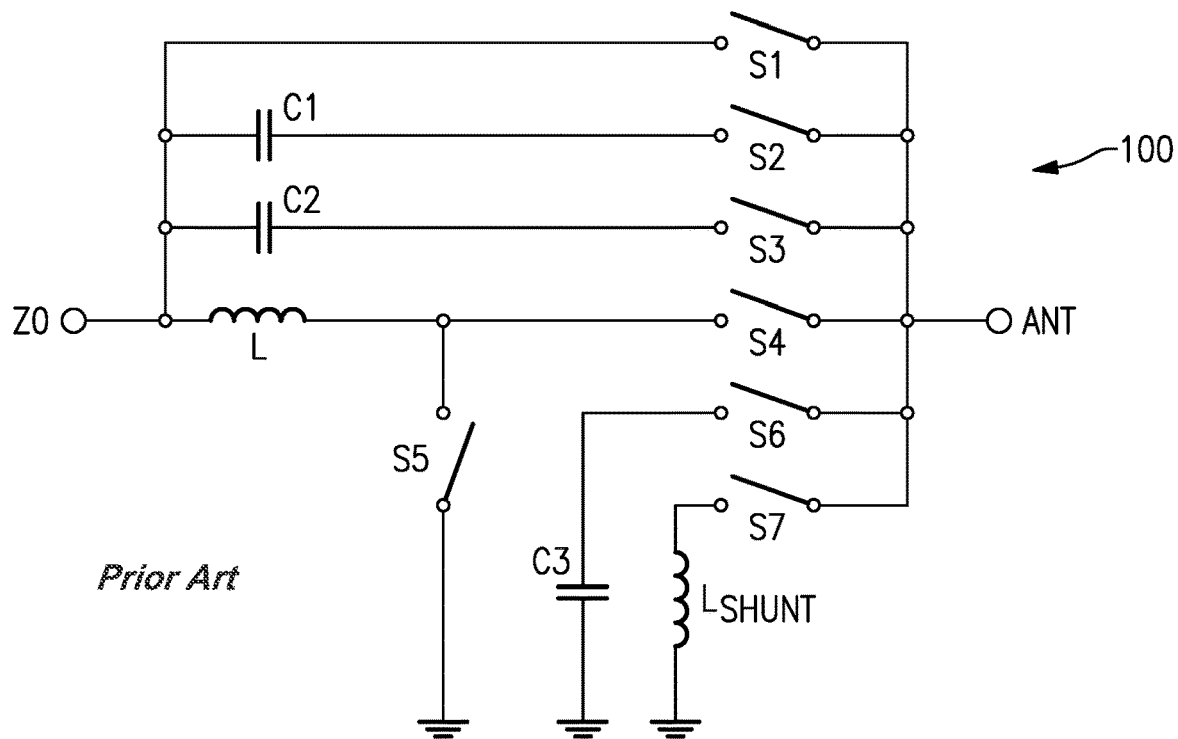
FIG.3 *Prior Art*
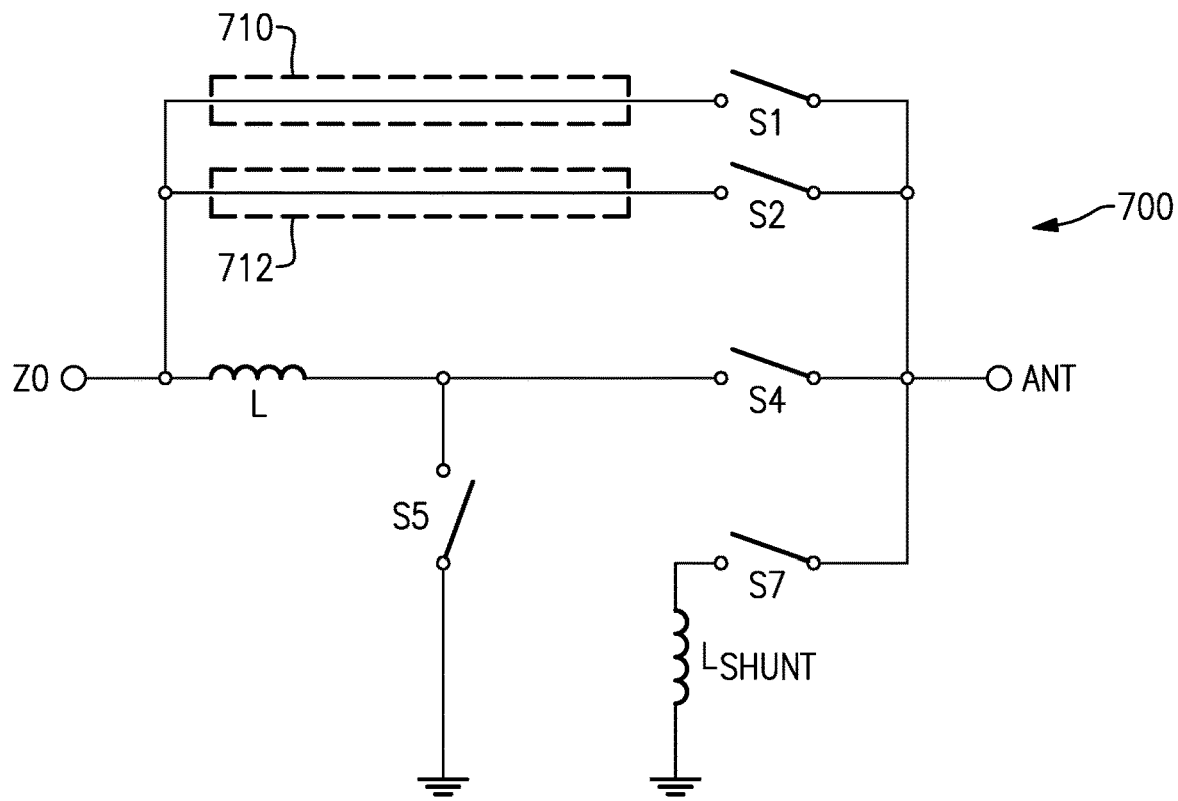
FIG.4

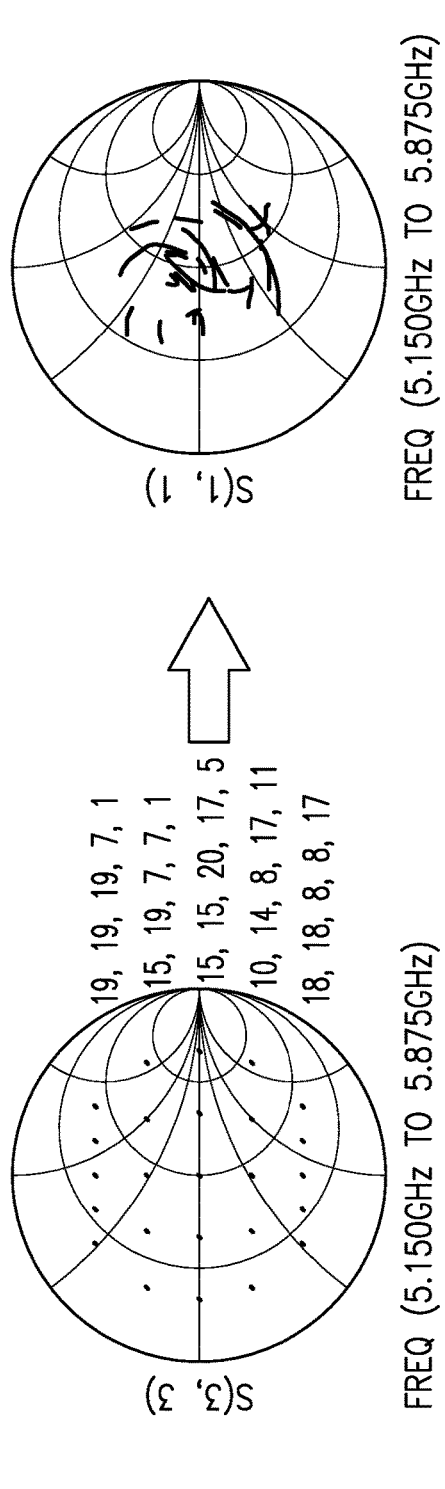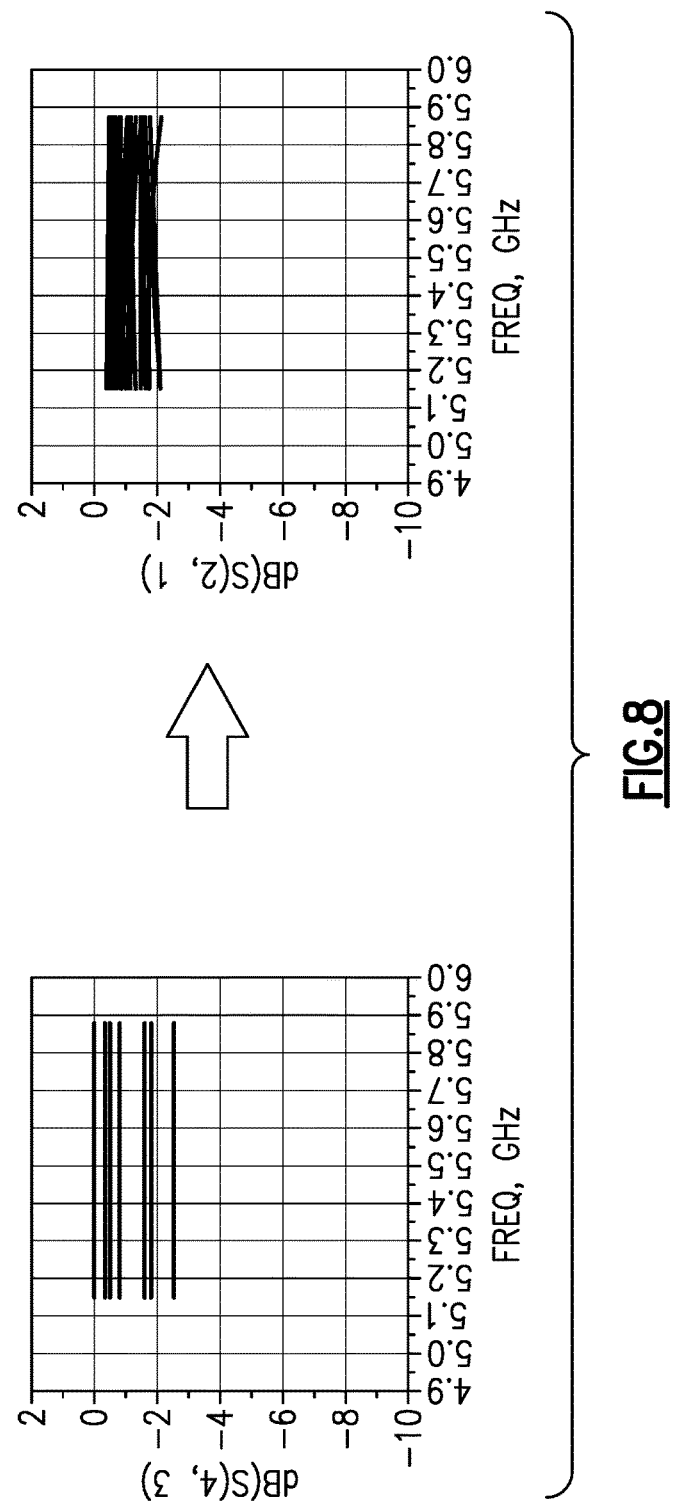
FIG.8

CIRCUITS, DEVICES AND METHODS RELATED TO IMPEDANCE TUNERS

CROSS-REFERENCE TO RELATED APPLICATION(S)

This application is a continuation of U.S. application Ser. No. 16/986,814 filed Aug. 6, 2020, now issued as U.S. Pat. No. 11,394,410 on Jul. 19, 2022, entitled CAPLESS IMPEDANCE TUNER, which claims priority to and the benefit of the filing date of U.S. Provisional Application No. 62/884,146 filed Aug. 7, 2019, entitled CAPLESS IMPEDANCE TUNER, the benefits of the filing dates of which are hereby claimed and the disclosures of which are hereby expressly incorporated by reference herein in their entirety.

BACKGROUND

Field

The present disclosure relates to impedance tuners for radio-frequency (RF) applications.

Description of the Related Art

In radio-frequency (RF) applications, power transfer is improved for a signal when impedance is matched between two components encountered by the signal. For example, when a signal is generated by a radio circuit and sent to an antenna for transmission, it is desirable to have as much of the signal's power be delivered to the antenna.

In the foregoing antenna-transmission example, the radio circuit is typically designed to maximize power transfer when the antenna provides a desired impedance. However, the antenna and/or the related antenna feedline may present an actual impedance that is significantly different than the desired impedance. In such a situation, power transmission efficiency becomes degraded.

SUMMARY

In accordance with a number of implementations, the present disclosure relates to an impedance tuner that includes a first node and a second node, and a first series path, a second series path, and an inductance path, with each path being implemented between the first node and the second node, and including a switch configured to allow the path to couple or uncouple the first and second nodes. Each of the first and second series paths is configured to allow a substantially continuous flow of a direct current between the first node and the second node when the respective switch couples the first and second nodes. The impedance tuner further includes a shunt path implemented between the second node and ground, and including a switch configured to allow the shunt path to couple or uncouple the second node and the ground. The impedance tuner further includes a switchable grounding path implemented along the inductance path and configured to allow the inductance path to function as a series inductance path between the first and second nodes, or as a shunt inductance path between the ground and a node along the inductance path.

In some embodiments, the shunt path can be an inductance shunt path. In some embodiments, the impedance tuner can be configured to not include a capacitance shunt path between the second node and the ground. In some embodiments, each of the first series path and the second series path can be configured to not include a discrete component capacitor or a metal-insulator-metal capacitor.

In some embodiments, impedance tuner can be configured such that the switch of the first series path is S1, the switch of the second series path is S2, the switch of the inductance path is S4, the switch of the grounding path is S5, and the switch of the shunt path is S7. The switches S1 to S7 can be configured to be capable of introducing zero, one or two elements between the first and second nodes to provide a bypass functionality or an impedance transformation functionality. Each element can include an inductance element. Each element can include a parasitic capacitance associated with a signal path. The signal path can include the first series path or the second series path.

In some embodiments, the impedance transformation state can be one of a plurality of impedance transformations each from an initial impedance to a desired impedance. Each of the initial impedances can be within a respective impedance zone having a center impedance value on a constant voltage standing wave ratio circle on a Smith chart, and the desired impedance can include a matched impedance at the center of the Smith chart. The constant voltage standing wave ratio can have a normalized value that is greater than or equal to 3.

In some embodiments, the bypass functionality can include S1 being ON and all of the other switches being OFF, such that the first series path connects the first and second nodes. In some embodiments, the bypass functionality can include each of S1 and S2 being ON and all of the other switches being OFF, such that a parallel combination of the first series path and the second series path connects the first and second nodes. In some embodiments, the bypass functionality can include S1 or S2 being ON, S4 being ON, and all of the other switches being OFF, such that a parallel combination of either of the first and second series paths and the inductance path connects the first and second nodes. In some embodiments, the bypass functionality can include each of S1, S2 and S4 being ON and all of the other switches being OFF, such that a parallel combination of the first series path, the second series path and the inductance path connects the first and second nodes.

In some embodiments, the first node can be a signal node for a radio circuit, and the second node can be an antenna node. The signal node can have a matched impedance, and the antenna node can be susceptible to a mismatched impedance.

In some implementations, the present disclosure relates to a semiconductor die that includes a substrate and an impedance tuner circuit implemented on the substrate. The impedance tuner includes a first node and a second node, a first series path, a second series path, and an inductance path, with each path being implemented between the first node and the second node, and including a switch configured to allow the path to couple or uncouple the first and second nodes. Each of the first and second series paths is configured to allow a substantially continuous flow of a direct current between the first node and the second node when the respective switch couples the first and second nodes. The impedance tuner circuit further includes a shunt path implemented between the second node and ground, and including a switch configured to allow the shunt path to couple or uncouple the second node and the ground. The impedance tuner circuit further includes a switchable grounding path implemented along the inductance path and configured to allow the inductance path to function as a series inductance path between the first and second nodes, or as a shunt inductance path between the ground and a node along the inductance path.

In some teachings, the present disclosure relates to a packaged module that includes a packaging substrate configured to receive and support a plurality of components, and an impedance tuner circuit implemented on the packaging substrate. The impedance tuner includes a first node and a second node, a first series path, a second series path, and an inductance path, with each path being implemented between the first node and the second node, and including a switch configured to allow the path to couple or uncouple the first and second nodes. Each of the first and second series paths is configured to allow a substantially continuous flow of a direct current between the first node and the second node when the respective switch couples the first and second nodes. The impedance tuner circuit further includes a shunt path implemented between the second node and ground, and including a switch configured to allow the shunt path to couple or uncouple the second node and the ground. The impedance tuner circuit further includes a switchable grounding path implemented along the inductance path and configured to allow the inductance path to function as a series inductance path between the first and second nodes, or as a shunt inductance path between the ground and a node along the inductance path.

According to some implementations, the present disclosure relates to a wireless device that includes a radio circuit, an antenna, and an impedance tuner implemented between the radio circuit and the antenna. The impedance tuner includes a first node and a second node, a first series path, a second series path, and an inductance path, with each path being implemented between the first node and the second node, and including a switch configured to allow the path to couple or uncouple the first and second nodes. Each of the first and second series paths is configured to allow a substantially continuous flow of a direct current between the first node and the second node when the respective switch couples the first and second nodes. The impedance tuner further includes a shunt path implemented between the second node and ground, and including a switch configured to allow the shunt path to couple or uncouple the second node and the ground. The impedance tuner further includes a switchable grounding path implemented along the inductance path and configured to allow the inductance path to function as a series inductance path between the first and second nodes, or as a shunt inductance path between the ground and a node along the inductance path.

In some embodiments, the impedance tuner can be configured to adjust an impedance state of the antenna to a tuned impedance state associated with the radio circuit. In some embodiments, the antenna can be configured to support a transmit operation, and the radio circuit can include a transmitter circuit. In some embodiments, the antenna can be configured to support a receive operation, and the radio circuit can include a receiver circuit. In some embodiments, the antenna and the radio circuit can be configured to support operations involving one or more cellular frequency bands. In some embodiments, the antenna and the radio circuit can be configured to support operations involving one or more wireless local area network frequency bands.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 3 shows an example of an impedance tuner circuit.

FIG. 4 shows an example of a capless impedance tuner that can be implemented to provide impedance tuning functionalities similar to the example impedance tuner circuit of FIG. 3.

FIG. 8 shows examples of improvements in performance that can be achieved by the impedance tuner circuit of FIG. 6 operated in the 5 GHz WLAN band.

DETAILED DESCRIPTION OF SOME EMBODIMENTS

The headings provided herein, if any, are for convenience only and do not necessarily affect the scope or meaning of the claimed invention.

Figure 1:
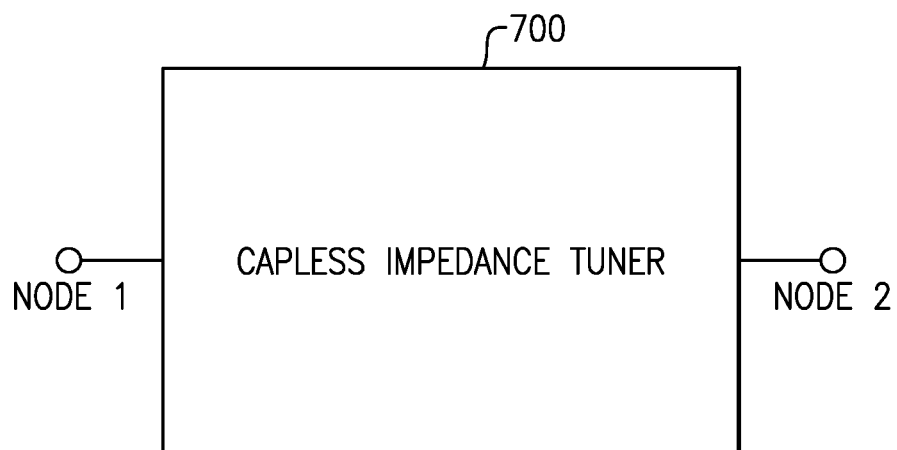
FIG. 1 depicts a capless impedance tuner having one or more features as described herein.

FIG. 1 depicts a capless impedance tuner 700 having one or more features as described herein. Such a capless impedance tuner can be implemented between a first node (Node 1) and a second node (Node 2), and be configured to provide tunable matching of impedance between the first and second nodes. For example, suppose that an impedance presented at the second node (e.g., by a load connected to the second node) is different from a desired impedance for which a signal is provided to the first node (e.g., from a circuit). If the capless impedance tuner 700 is absent, the first and second nodes can be essentially the same, and the signal can be presented with the mismatched impedance of the load at the first node. With the capless impedance tuner 700 implemented between the first and second nodes, the capless impedance tuner 700 can change the mismatched impedance of the load, so that an impedance presented to the signal at the first node is at the desired impedance, approximately at the desired impedance, or closer to the desired impedance.

For the purpose of description, a capless impedance tuner such as the capless impedance tuner 700 of FIG. 1 may also be referred to herein as, for example, a capless impedance tuner circuit, a capless impedance tuning circuit, a capless tuner circuit, a capless tuning circuit, a capless tuner, etc., or simply as an impedance tuner circuit, an impedance tuning circuit, a tuner circuit, a tuning circuit, a tuner, etc.

Figure 2:
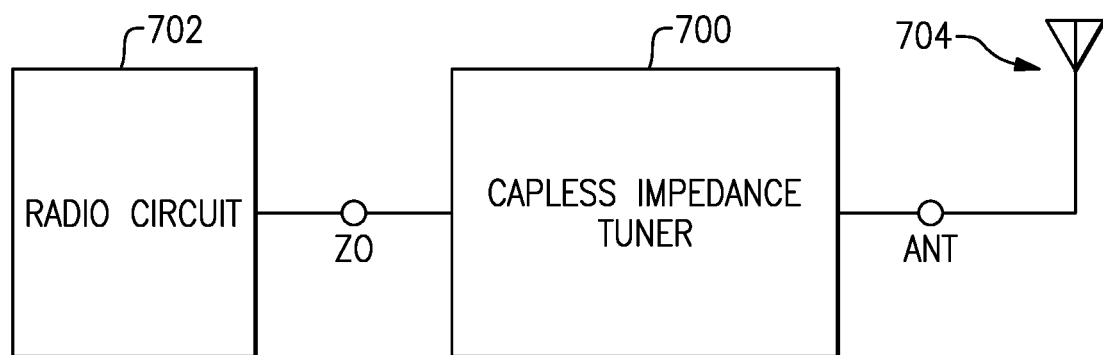
FIG. 2 shows that in some embodiments, the capless impedance tuner of FIG. 1 can be utilized as an impedance tuner implemented between a radio circuit and an antenna.

FIG. 2 shows that in some embodiments, the capless impedance tuner 700 of FIG. 1 can be utilized as a capless impedance tuner 700 implemented between a radio circuit 702 and an antenna 704. For the purpose of description, it is assumed that the radio circuit 702 operates with a source impedance (e.g. Z0=50 ohms), and the antenna 704 presents a load impedance at an antenna node (ANT); and such a load impedance of the antenna 704 can vary (e.g., due to environmental factor(s)). For the purpose of description, it will be assumed that the load impedance presented at the antenna node (ANT) may or may not include a contribution from, for example, an antenna feedline.

Referring to FIG. 2, the capless impedance tuner 700 can be implemented to match the load impedance of the antenna 704 to the source impedance Z0 or move the load impedance closer to the source impedance, so as to maximize or improve the power transfer between the radio circuit 702 and the antenna 704. For example, a power amplified radio-frequency (RF) signal can be generated by the radio circuit 702 for transmission through the antenna 704, and power transferred from the radio circuit 702 to the antenna 704 can be desirably maximized or increased when the load impedance of the antenna (ANT) is matched with or is closer to the source impedance Z0 of the radio circuit 702. In another example, a signal received through the antenna (ANT) can be efficiently transferred to the radio circuit 702 for processing, when the impedance of the antenna (ANT) is matched with or is closer to the impedance Z0 of the radio circuit 702.

It is noted that antenna impedance tuning can be accomplished by placing a tuning circuit (also referred to herein as a tuner) along an antenna feed line. Such a tuner can be implemented as a programmable matching network. It is also noted that any insertion loss associated with the tuner subtracts from an improvement (e.g., s21 improvement) benefit resulting from the matching. Accordingly, it is desirable to have losses be minimized or reduced for a given tuner.

A tuner can be configured to have its s21 improvement maximized or increased by providing a fine-tuning capability by, for example, having many selectable capacitors implemented with a large number of switches. Such switches, however, can result in increased insertion loss.

U.S. Publication No. 2019/0253087 discloses, among others, impedance tuning techniques that can be implemented with circuit elements including series and shunt capacitors. FIG. 3 shows an example of an impedance tuner circuit 100 that is described in greater detail in U.S. Publication No. 2019/0253087 (in reference to FIG. 23 therein).

In such an example, four branches (a bypass path with S1, a capacitance path with C1 and S2, a capacitance path with C2 and S3, and an inductance path with L and S4) are shown to be implemented between nodes Z0 and ANT. The impedance tuner circuit 100 of FIG. 3 (FIG. 23 in U.S. Publication No. 2019/0253087) is also shown to include a capacitance shunt path with S6 and C3.

In the example of FIG. 3, the capacitances C1, C2 and C3 can be provided by, for example, discrete component capacitors, metal-insulator-metal (MIM) capacitors, or some combination thereof.

In some embodiments, an impedance tuner circuit having one or more features as described herein can include one or more capless paths, where each capless path provides a capacitance path functionality without a capacitor such as a discrete component capacitor or an MIM capacitor. In some embodiments, such an impedance tuner circuit can also be implemented without any capacitance shunt path having a capacitor such as a discrete component capacitor or an MIM capacitor. Accordingly, in some embodiments, an impedance tuner circuit can be implemented as a capless impedance tuner that includes at least one capless path, with or without other capacitance path(s) with respective capacitor(s), and with or without any capacitance shunt path(s) with respective capacitor(s). In some embodiments, a capless impedance tuner can be implemented so as to not include any capacitor such as a discrete component capacitor or an MIM capacitor.

As described herein, such an impedance tuner circuit can be implemented with a reduced number of switches for reduced switch loss as a tradeoff with a lesser fine tuning capability.

In some embodiments, a capless path of a capless impedance tuner (with or without other capacitor(s)) can be configured to include a first node (e.g., an input node), a second node (e.g., an output node), and a signal path implemented between the first and second nodes so as to provide a substantially continuous flow of a direct current (DC) signal between the first and second nodes. Such a signal path can be implemented without a capacitor having first and second terminals along the signal path, since such first and second terminals separated by a dielectric would block a DC signal between the first and second signals. Thus, in some embodiments, a capless path as described herein can be implemented as, for example, a continuous signal path such as a continuous metal trace between the first and second nodes. Examples related to such a capless path are described herein in greater detail.

FIG. 4 shows an example of a capless impedance tuner 700 that can be implemented to provide impedance tuning functionalities similar to the example impedance tuner circuit 100 of FIG. 3. Similar to the impedance tuner circuit 100 of FIG. 3, the capless impedance tuner 700 of FIG. 4 can be configured to include a plurality of switchable paths implemented between nodes Z0 and ANT. Examples related to impedances associated with such nodes are provided in greater detail in the above-referenced U.S. Publication No. 2019/0253087.

Referring to the examples of FIGS. 3 and 4, it is noted that a switchable inductance path with L and S4 between the nodes Z0 and ANT of FIG. 4 can be similar in topology as the inductance path with L and S4 between the nodes Z0 and ANT of FIG. 3, and each of L and S4 of FIG. 4 may or may not have a similar value (e.g., inductance or Ron value) as the corresponding part (L or S4) of FIG. 3. More specific examples of L and S4 of FIG. 4 are described herein in greater detail.

Referring to the examples of FIGS. 3 and 4, it is also noted that a switchable grounding path with switch S5 of FIG. 4 can be similar in topology as the switchable grounding path with switch S5 of FIG. 3, and S5 of FIG. 4 may or may not have a similar value (e.g., Ron value) as S5 of FIG. 3. More specific examples related to S5 of FIG. 4 are described herein in greater detail.

Referring to the examples of FIGS. 3 and 4, it is also noted that a switchable shunt path with $L_{shunt}$ and S7 of FIG. 4 can be similar in topology as the switchable shunt path with $L_{shunt}$ and S7 of FIG. 3, and each of $L_{shunt}$ and S7 of FIG. 4 may or may not have a similar value (e.g., inductance or Ron value) as the corresponding part ($L_{shunt}$ or S7) of FIG. 3. More specific examples of $L_{shunt}$ and S7 of FIG. 4 are described herein in greater detail.

Referring to the examples of FIGS. 3 and 4, it is noted that a capacitance shunt path (with S6 and C3 in FIG. 3) can be omitted in the capless impedance tuner 700 of FIG. 4. Accordingly, the example capless impedance tuner 700 of FIG. 4 does not have any switchable capacitance shunt path.

Referring to the examples of FIGS. 3 and 4, it is noted that two capless paths 710, 712 and their respective switches S1, S2 of FIG. 4 can be configured to provide functionalities associated with three switchable paths (the switchable bypass path with S1, the capacitance path with C1 and S2, and the capacitance path with C2 and S3) of FIG. 3. More specific examples of such capless paths are described herein in greater detail.

In some embodiments, a capless path having one or more features as described herein can include a metal trace implemented on and/or within a substrate such as a semiconductor substrate, so as to provide a substantially continuous electrical path for a direct current (DC) signal between a first node and a second node. Such a metal trace can be formed on one or more layers associated with such a substrate. If the metal trace includes portions formed on different layers, such portions can be electrically connected by an electrically conductive feature such as a conductive via.

It is noted that a metal trace utilized for a signal path typically includes some inductance property and some capacitance property. By way of an example, a given metal trace can provide a parasitic effect such as a parasitic capacitance. Thus, in some embodiments, a capless path having one or more features as described herein can be configured to provide such inductance and/or capacitance properties. Such inductance and/or capacitance properties can be achieved by, for example, appropriate dimensions (e.g., length and/or width), shapes (e.g., lateral bends), materials, or some combination thereof. In some embodiments, a capless path can be implemented as a metal trace configured to provide a parasitic capacitive impedance effect, rather than utilizing a lumped capacitor. In the context of metal trace implementations, it is noted that such metal traces can provide greater reliability than on-chip capacitors such as MIM capacitors.

Figure 5:
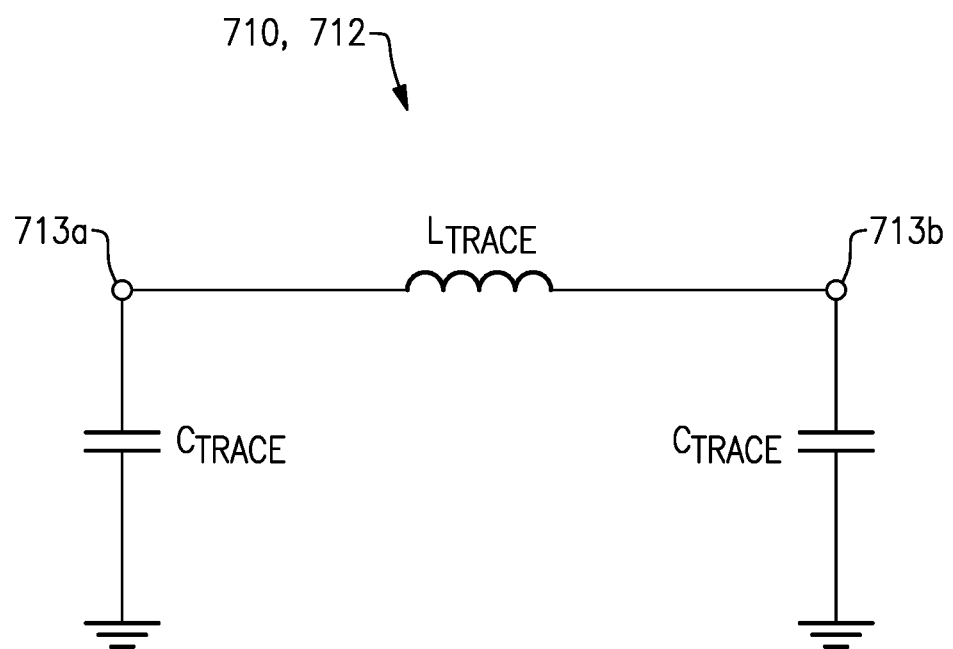
FIG. 5 shows that in some embodiments, inductance and/or capacitance properties of a capless path can be estimated as an equivalent inductance/capacitance (LC) circuit implemented between first and second nodes.

FIG. 5 shows that in some embodiments, the foregoing inductance and/or capacitance properties of a capless path (710 or 712) can be estimated as an equivalent inductance/capacitance (LC) circuit implemented between the first and second nodes (713a, 713b). In such an equivalent circuit, an inductance $L_{trace}$ associated with the metal trace can exist between the first and second nodes 713a, 713b, and a capacitance $C_{trace}$ can exist between each of the first and second nodes 713a, 713b and ground. In some embodiments, values of $L_{trace}$ and $C_{trace}$ can be obtained by an appropriately configured metal trace to provide the capless path functionality.

Figure 6:
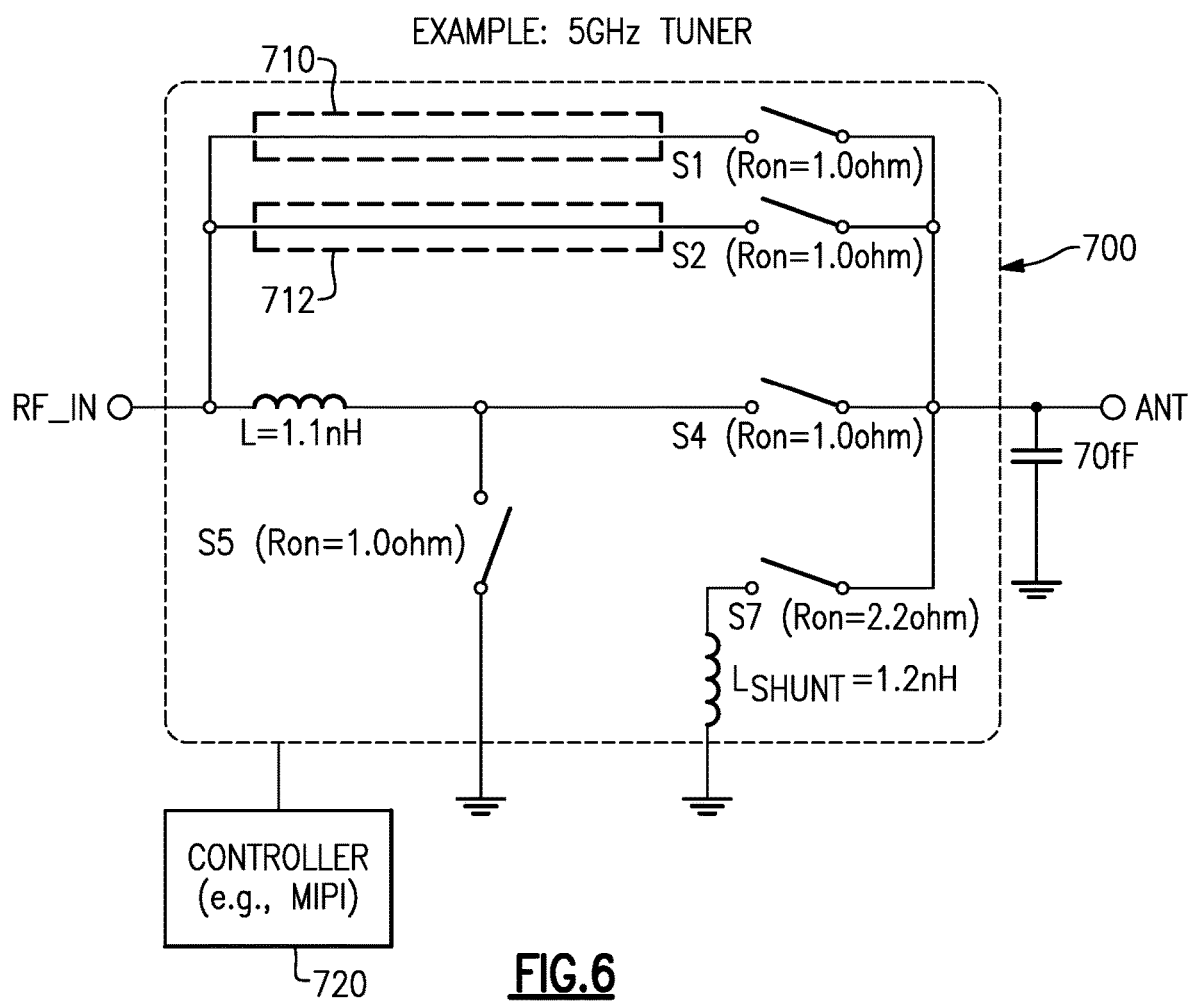
FIG. 6 shows an example where the impedance tuner circuit of FIG. 4 is configured to support a 5 GHz wireless local area network (WLAN) frequency range (5,150 to 5,875 MHz).

FIG. 6 shows an example where the impedance tuner circuit 700 of FIG. 4 is configured to support a 5 GHz wireless local area network (WLAN) frequency range (5,150 to 5,875 MHz). FIG. 6 also shows that in some embodiments, operation of such an impedance tuner circuit can be supported by a controller 720 utilizing, for example, Mobile Industry Processor Interface (MIPI) based signals. Such control signals can be utilized to, for example, control the states of the various switches of the impedance tuner circuit 700.

Table 1 lists example values of inductances and switch on-resistances (Ron) associated with the impedance tuner circuit 700 of FIG. 6 configured for the 5 GHz operation.

TABLE 1

| Circuit element | Electrical property |
| --- | --- |
| S1 | Ron = 1.0 ohm |
| S2 | Ron = 1.0 ohm |
| S4 | Ron = 1.0 ohm |
| S5 | Ron = 1.0 ohm |
| S7 | Ron = 2.2 ohm |
| L | Inductance = 1.1 nH |
| $L_{shunt}$ | Inductance = 1.2 nH |

It is noted that the impedance tuner circuit 700 of FIG. 6 includes five switches. Assuming that each switch can be in an ON (e.g., 1) state or an OFF (e.g., 0) state, the impedance tuner circuit 700 itself can have a total of $2^5=32$ switching states. It is further noted that some of such 32 states may not be utilized, or achieve similar functionality of the impedance tuner circuit 700.

Table 2 lists examples of states of the five switches that can provide various switching configurations for the impedance tuner circuit 700 of FIG. 6.

TABLE 2

| Tune state | S1 | S2 | S4 | S5 | S7 |
| --- | --- | --- | --- | --- | --- |
| 1 | 0 | 0 | 1 | 0 | 0 |
| 2 | 0 | 0 | 1 | 0 | 1 |
| 3 | 0 | 1 | 0 | 0 | 0 |
| 4 | 0 | 1 | 0 | 0 | 1 |
| 5 | 0 | 1 | 0 | 1 | 0 |
| 6 | 0 | 1 | 0 | 1 | 1 |
| 7 | 0 | 1 | 1 | 0 | 0 |
| 8 | 0 | 1 | 1 | 0 | 1 |
| 9 | 1 | 0 | 0 | 0 | 0 |
| 10 | 1 | 0 | 0 | 0 | 1 |
| 11 | 1 | 0 | 0 | 1 | 0 |
| 12 | 1 | 0 | 0 | 1 | 1 |
| 13 | 1 | 0 | 1 | 0 | 0 |
| 14 | 1 | 0 | 1 | 0 | 1 |
| 15 | 1 | 1 | 0 | 0 | 0 |
| 16 | 1 | 1 | 0 | 0 | 1 |
| 17 | 1 | 1 | 0 | 1 | 0 |
| 18 | 1 | 1 | 0 | 1 | 1 |
| 19 | 1 | 1 | 1 | 0 | 0 |
| 20 | 1 | 1 | 1 | 0 | 1 |

Figure 7A:
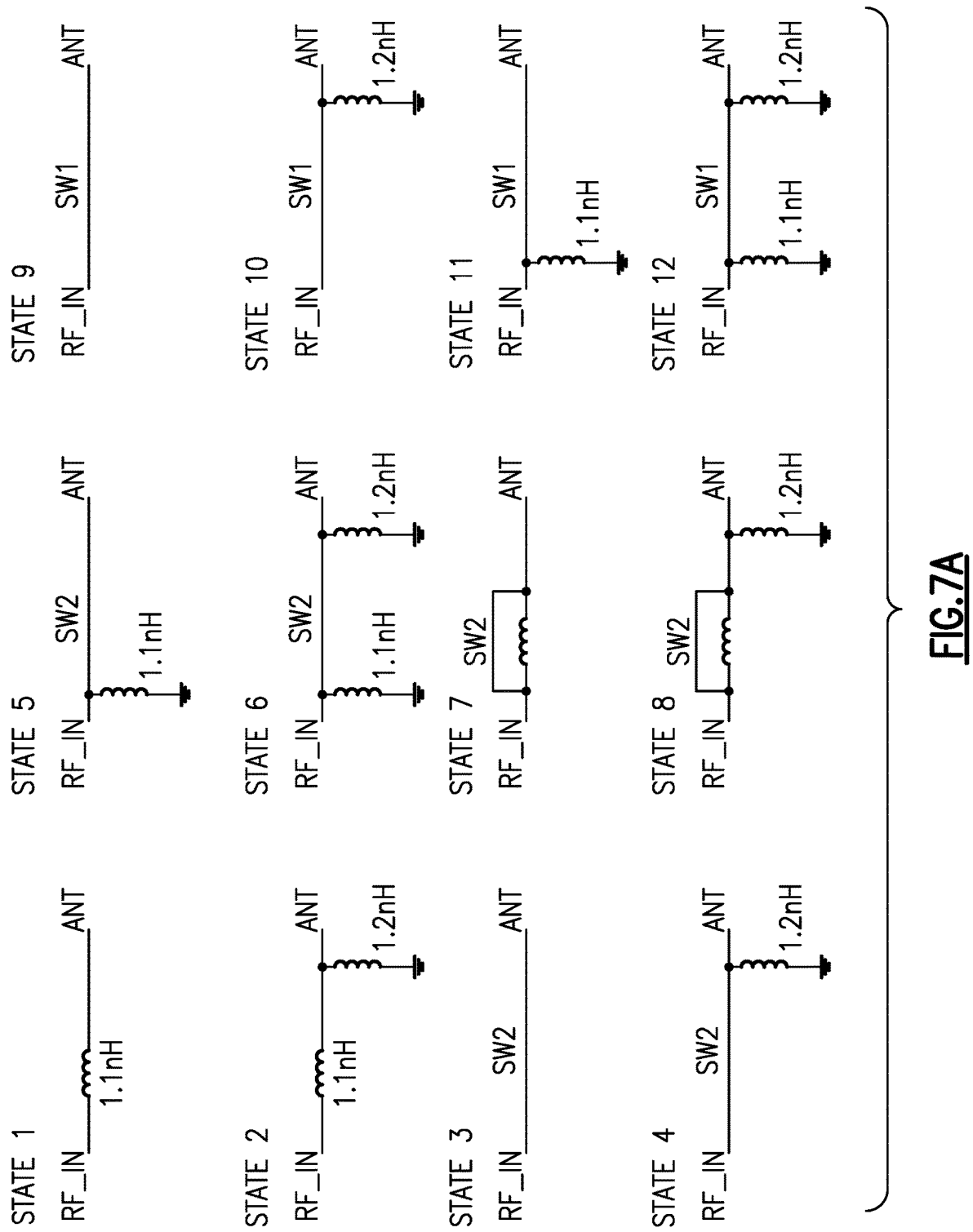
FIGS. 7A and 7B show equivalent circuits corresponding to various tune states for the impedance tuner circuit of FIG. 6.
Figure 7B:
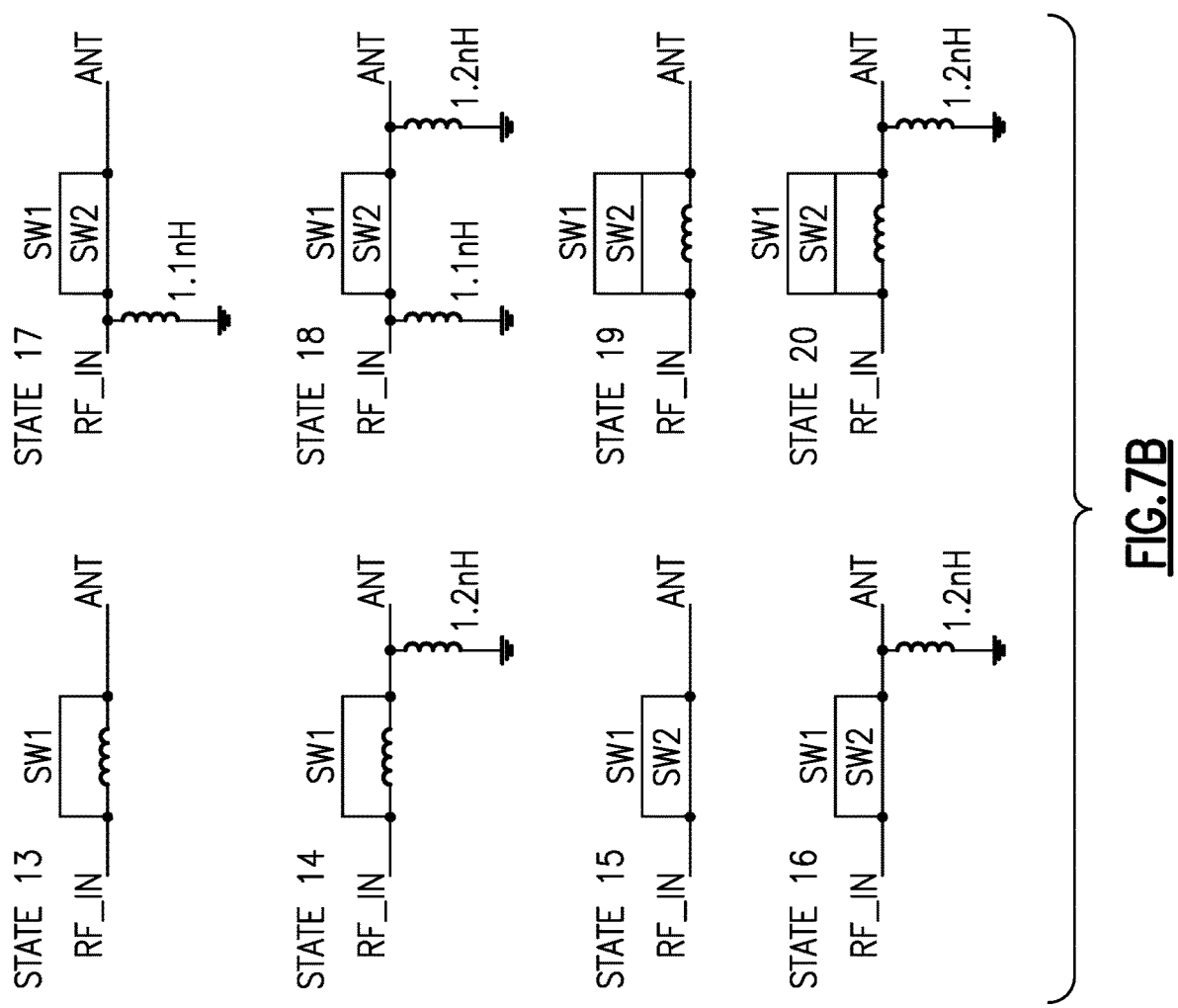

FIGS. 7A and 7B show equivalent circuits corresponding to the various tune states of Table 2, for the impedance tuner circuit 700 of FIG. 6. As described in reference to FIG. 4, the paths associated with the switches S1 and S2 are the capless paths 710, 712, respectively. In some embodiments, each of such capless paths can be utilized by itself or in combination with one or more other paths to provide various tuning functionalities. Such tuning functionalities can involve use of a given capless path's equivalent inductance and/or capacitance properties, such as those described in reference to FIG. 5.

It is noted that tuning functionalities can also include a bypass functionality. In some embodiments, such a bypass functionality can be provided by different combinations of the capless paths 710, 712 and their respective switches S1, S2. For example, and as shown in State 9 of FIG. 7A, a bypass functionality can be provided by S1 (also indicated as SW1) being ON and all other switches being OFF. In another example, and as shown in State 3 of FIG. 7A, a bypass functionality can be provided by S2 (also indicated as SW2) being ON and all other switches being OFF. In yet another example, and as shown in State 15 of FIG. 7B, a bypass functionality can be provided by S1 and S2 being ON and all other switches being OFF.

It is noted that in some embodiments, a low loss bypass functionality can also be provided by either or both of the capless paths 710, 712 being enabled in parallel with the inductance path (L and S4 in FIG. 6). For example, and as shown in State 7 of FIG. 7A, a bypass functionality can be provided by S2 and S4 being ON and all other switches being OFF. In another example, and as shown in State 13 of FIG. 7B, a bypass functionality can be provided by S1 and S4 being ON and all other switches being OFF. In yet another example, and as shown in State 19 of FIG. 7B, a bypass functionality can be provided by S1, S2 and S4 being ON and all other switches being OFF. It is noted that the example of State 19 can provide the lowest bypass loss among the various bypass examples.

It is noted that a capacitance value associated with a switchable capacitance path of a lower frequency application (e.g., in a lowband tuner of FIG. 24 of U.S. Publication No. 2019/0253087) is significantly higher than a corresponding capacitance value associated with a switchable capacitance path of a higher frequency application (e.g., in a 5 GHz tuner of FIG. 36 of U.S. Publication No. 2019/0253087). For example, in FIG. 24 of U.S. Publication No. 2019/0253087, capacitances C1 and C2 associated with switches S1 and S2 are shown to have values of 3.0 pF and 6.0 pF, respectively. In FIG. 36 of U.S. Publication No. 2019/0253087, corresponding capacitances C1 and C2 associated with switches S1 and S2 are shown to have values of 0.1 pF and 0.2 pF.

Accordingly, an impedance tuner circuit having one or more features as described herein can be particularly appropriate at very high frequencies, such as in the example 5 GHz range of FIGS. 6 and 7. In such a frequency range application, capacitances become very small, and much of the tuning can therefore be effectively accomplished by one or more capless paths as described herein. For example, inductances and parasitic capacitances associated with metal traces and internal to a die or a packaged module can be utilized to provide various tuning states, including bypass states.

It will be understood that one or more features of the present disclosure can also be utilized in applications involving other frequency ranges where capacitances may or may not be small.

FIG. 8 shows examples of improvements in performance that can be achieved by the impedance tuner circuit 700 of FIG. 6 operated in the 5 GHz band. The upper left portion of FIG. 8 shows various untuned impedance states on a Smith chart. Such states span VSWR values less than or equal to 5.0, and are obtained for the 5 GHz frequency range (5,150 to 5,875 MHz). Tune states of Table 2 and FIGS. 7A and 7B that can be utilized to adjust or generally maintain the untuned states are indicated next to the Smith chart.

The upper right portion of FIG. 8 shows a Smith chart with tuned impedance states resulting from application of the foregoing tune state configurations to the untuned impedance states (upper left portion of FIG. 8). One can see that the tuned impedance states are clustered closer to the desired impedance state at the center of the Smith chart.

The lower left portion of FIG. 8 shows various forward transmission curves associated with the untuned impedance states, and the lower right portion of FIG. 8 shows forward transmission curves for the corresponding tuned impedance states. One can see that the tuned impedance states have forward transmission curves clustered around a value closer to the desired value of 0 dB.

Figure 9:
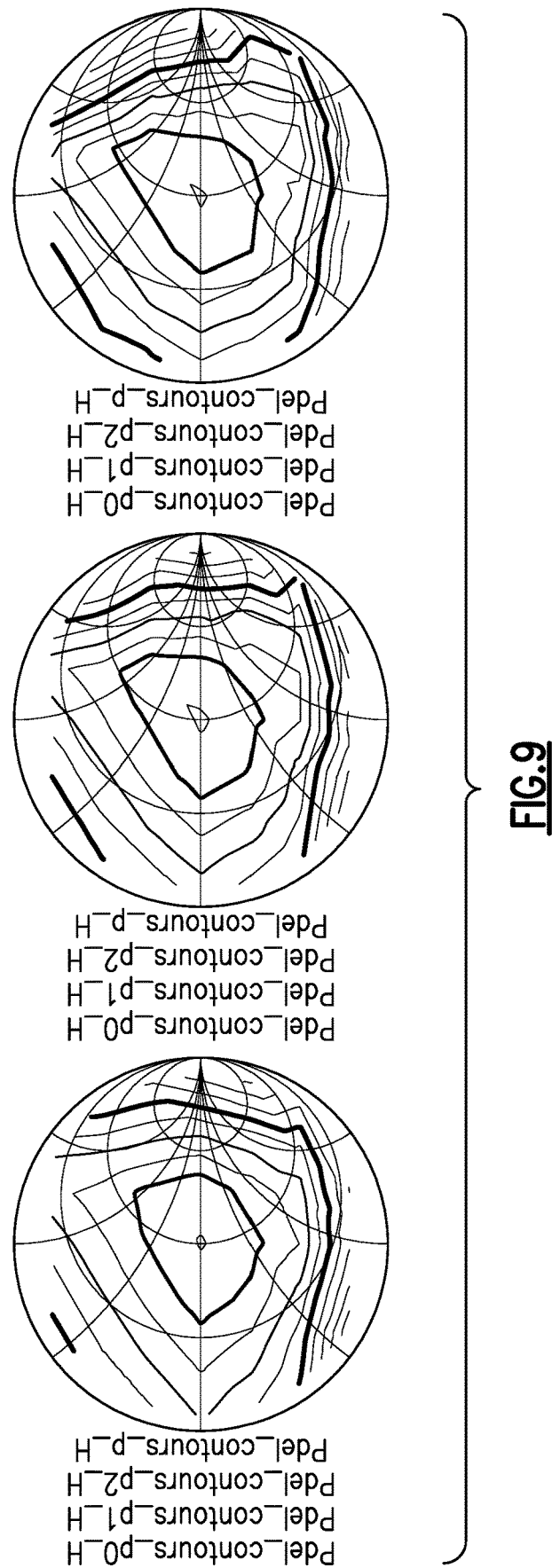
FIG. 9 shows examples of power delivery contour plots on Smith charts that can be achieved by the impedance tuner circuit of FIG. 6 operated in the 5 GHz WLAN band.

FIG. 9 shows examples of power delivery contour plots on Smith charts that can be achieved by the impedance tuner circuit 700 of FIG. 6 operated in the 5 GHz band. The left portion of FIG. 9 is for a lower portion (5,150 MHz) of the 5 GHz band, the center portion of FIG. 9 is for a middle portion (5,512 MHz) of the 5 GHz band, and the right portion of FIG. 9 is for a higher portion (5,875 MHz) of the 5 GHz band. Below each Smith chart is a summary of insertion loss values (mean value, worst value, best value) resulting from use of the impedance tuner circuit 700. The worst insertion loss of about 0.57 dB occurs at the middle frequency. Such an insertion loss is higher than a desired insertion loss condition (e.g., less than 0.4 dB); however, it is within a reasonable limit, and lower than the insertion loss of about 0.68 dB achieved in the example 5 GHz tuner of FIG. 36 of the above-referenced U.S. Publication No. 2019/0253087.

Figure 10:
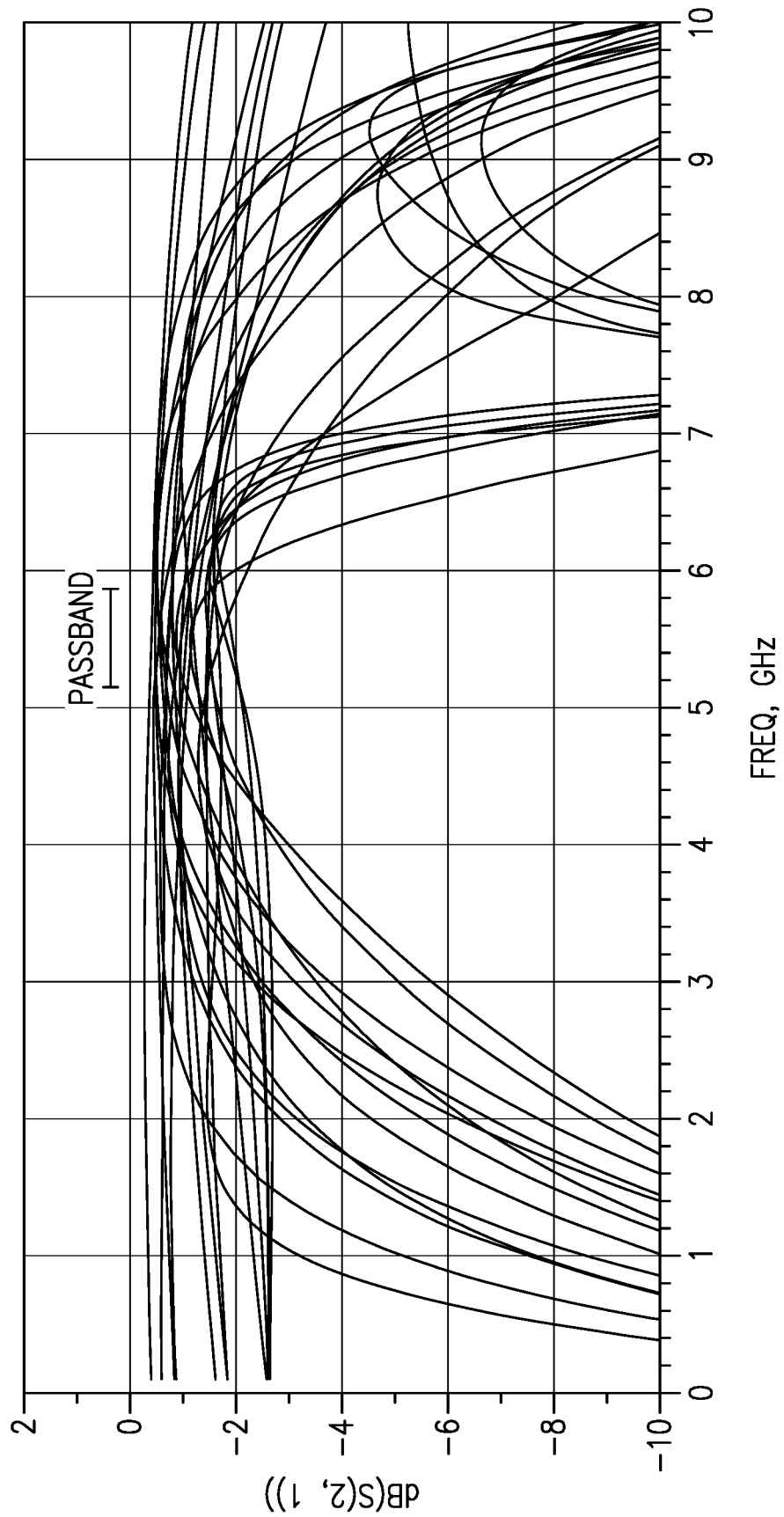
FIG. 10 shows an extension of the forward transmission plot for the tuned states of FIG. 8, obtained for a wider frequency range.

FIG. 10 is an extension of the forward transmission plot for the tuned states (lower right portion) of FIG. 8, obtained for a wider frequency range (about 100 MHz to 10,000 MHz). The forward transmission plot of FIG. 10 shows that the improved forward transmission performance is a wideband response that covers at least the 5 GHz frequency range (5,150 to 5,875 MHz).

Figure 11:
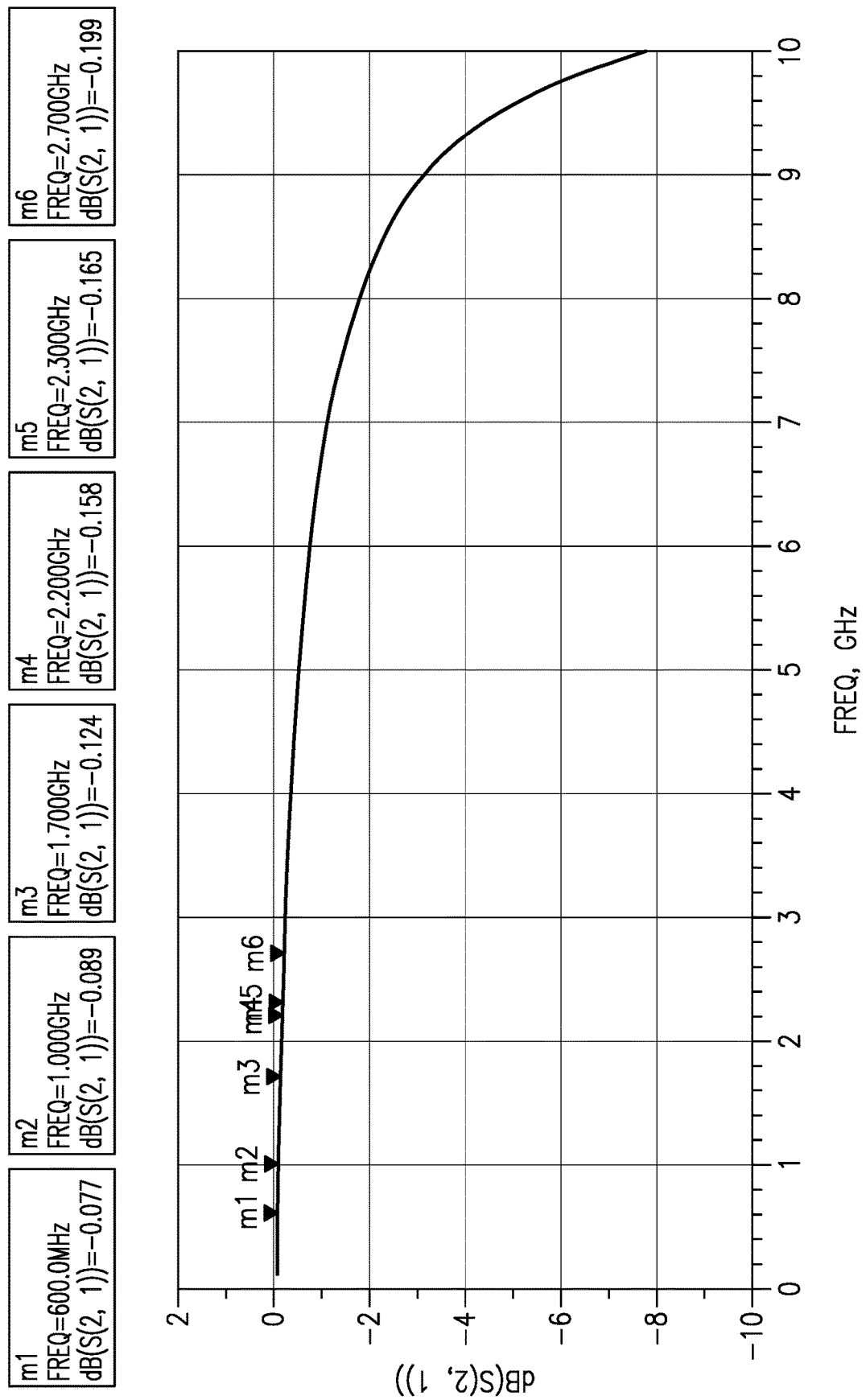
FIG. 11 shows a forward transmission plot as a function of frequency, for the example impedance tuner circuit of FIG. 6.

FIG. 11 shows a forward transmission (s21) plot as a function of frequency, for the example impedance tuner circuit 700 of FIG. 6 (configured for the 5 GHz band). With such a configuration, signals outside of the 5 GHz band can be bypassed. For such bypass modes, data points m1 to m6 show s21 values for various frequencies in LB, MLB and MHB frequency ranges, when in State 7 (with switches S2 and S4 ON, and all other switches OFF, as shown in FIG. 7A). One can see that such bypassed signals suffer relatively small loss that is less than 0.20 dB.

In the examples described herein in reference to FIGS. 4-6, a capless path (710 or 712) is depicted as a portion of a path leading up to the corresponding switch (S1 or S2). It will be understood that in some embodiments, a capless path having one or more features as described herein may or may not include the corresponding switch and/or a portion of the path on the other side of the switch.

Figure 12:
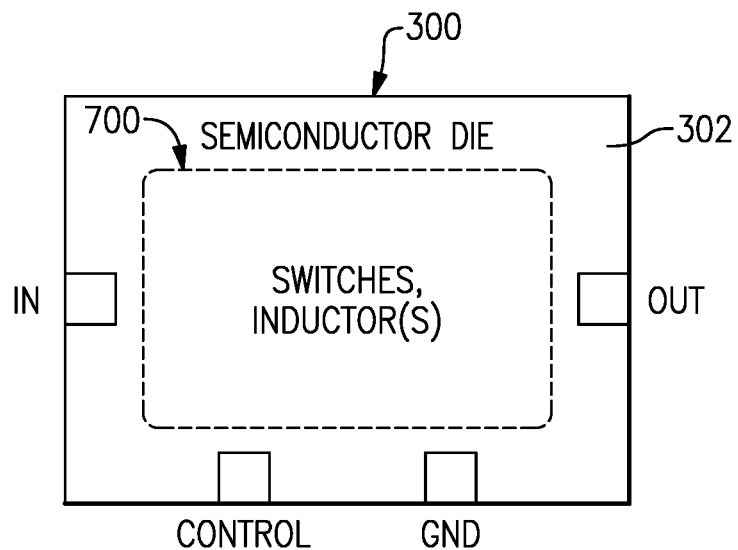
FIG. 12 shows that in some embodiments, an impedance tuner circuit having one or more features as described herein can be implemented on a semiconductor die.

In some implementations, the present disclosure relates to various devices that includes one or more impedance tuner circuits. For example, FIG. 12 shows that in some embodiments, an impedance tuner circuit 700 having one or more features as described herein can be implemented on a semiconductor die 300. In such a device, substantially all of the impedance tuner circuit 700, including switches (e.g., FETs) and inductor(s) (e.g., on-chip inductor trace(s)) can be implemented on and/or within a substrate 302 of the semiconductor die 300. In some embodiments, the impedance tuner circuit 700 can be substantially free of a capacitor such as a discrete component capacitor or an MIM capacitor. In some embodiments, such a semiconductor die can be, for example, a silicon-on-insulator (SOI) die.

FIG. 12 also shows that the semiconductor die 300 can further include a plurality of electrical contacts such as an input node (IN), an output node (OUT), one or more control nodes (Control), and a ground node (GND). Such electrical contacts can be implemented as, for example, wirebond pads on the upper side of the substrate 302, a grid array on the underside of the substrate 302, or some combination thereof.

In some embodiments, an impedance tuner circuit having one or more features as described herein can be implemented on a packaged module. For example, a packaged module can include a semiconductor die, such as the die 300 of FIG. 12, having substantially all of an impedance tuner circuit. Such a die can be mounted on a packaging substrate of the module, along with one or more other components.

Figure 13:
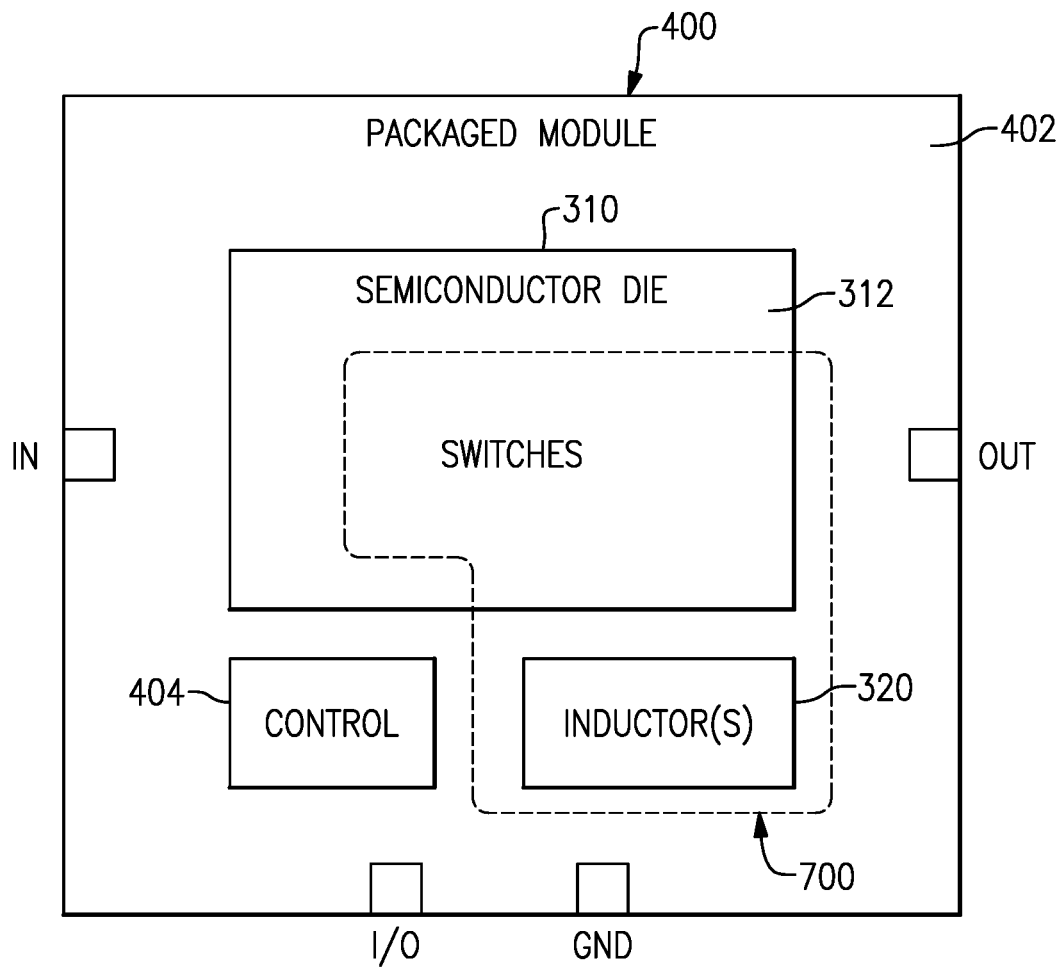
FIG. 13 shows that an impedance tuner circuit having one or more features as described herein can be implemented so that some of the impedance tuner circuit is on a semiconductor die, and the remainder is implemented off of the die.

In another example, FIG. 13 shows that an impedance tuner circuit 700 having one or more features as described herein can be implemented so that some of the impedance tuner circuit 700 is on a semiconductor die 310, and the remainder is implemented off of the die 310. For example, a packaged module 400 can include a packaging substrate 402 configured to receive and support a plurality of components. Such components can include the semiconductor die 310 (e.g., an SOI die) having a substrate 312, and switches (e.g., FETs) associated with the impedance tuner circuit 700 can be implemented on such a substrate (312).

In the example of FIG. 13, one or more inductors 320 (e.g., discrete component inductor(s)) can be mounted on the packaging substrate 402 and be electrically connected to the semiconductor die 310 so as to be part of the impedance tuner circuit 700. In some embodiments, the packaged module 400 can further include a control component 404 configured to control, or support control of, the impedance tuner circuit 700. Such a control component can be based on, for example, MIPI standards.

In the example of FIG. 13, the impedance tuner circuit 700 can be substantially free of a capacitor such as a discrete component capacitor or an MIM capacitor. The packaged module 400 may or may not include one or more capacitors implemented for other purposes.

FIG. 13 also shows that the packaged module 400 can further include a plurality of electrical contacts such as an input node (IN), an output node (OUT), one or more I/O nodes (e.g., control and/or power), and a ground node (GND). Such electrical contacts can be implemented as, for example, wirebond pads on the upper side of the packaging substrate 402, solder pads or a grid array on the underside of the packaging substrate 402, or some combination thereof.

Figure 14:
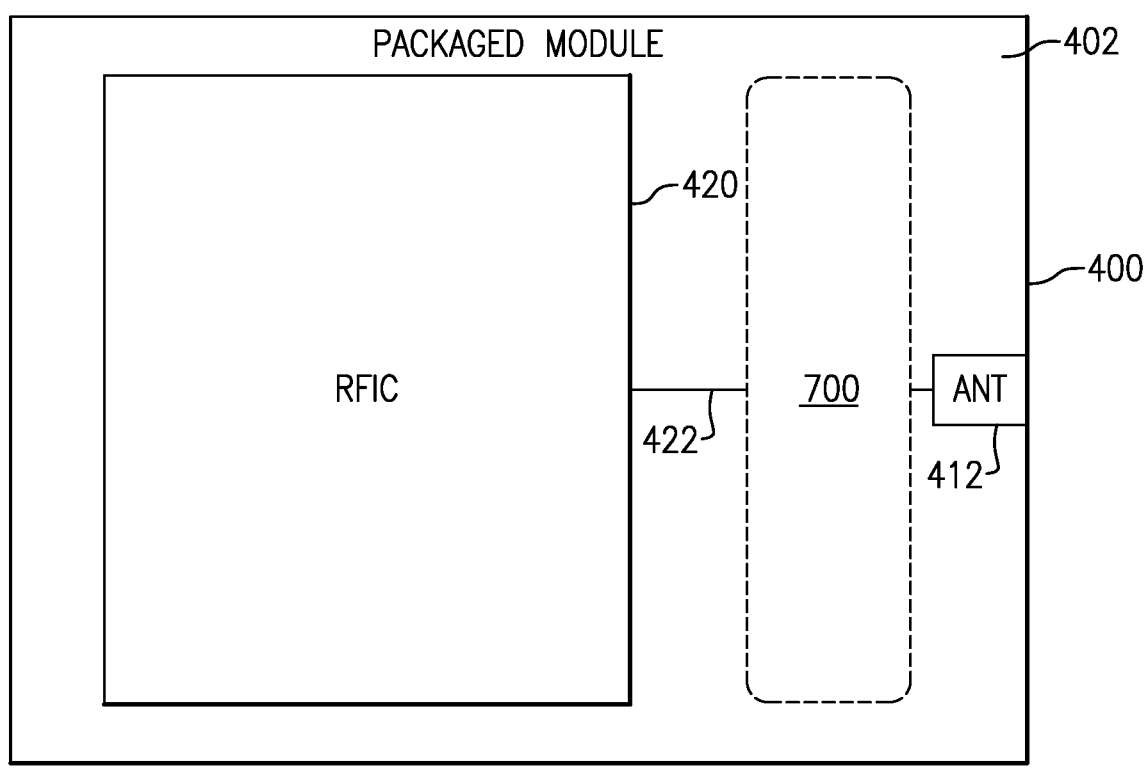
FIG. 14 shows that in some embodiments, a packaged module can include a radio-frequency integrated circuit (RFIC) such as a front-end system configured to operate with an antenna through an antenna node.

In yet another example, FIG. 14 shows that in some embodiments, a packaged module 400 can include a radio-frequency integrated circuit (RFIC) 420 such as a front-end system configured to operate with an antenna through an antenna node (ANT) 412. At least some of the RFIC 420 can be implemented on one or more semiconductor die, and such die can be mounted on a packaging substrate 402 of the packaged module 400.

In the example of FIG. 14, an impedance tuner circuit 700 having one or more features as described herein can be implemented along a signal path 422 between the RFIC 420 and the antenna node 412. It will be understood that the antenna node 412 can be coupled to a transmit antenna (in which case the RFIC 420 may include a transmit functionality), a receive antenna (in which case the RFIC 420 may include a receive functionality), or a transmit/receive antenna (in which case the RFIC 420 may include transmit and receive functionalities).

Figure 15:
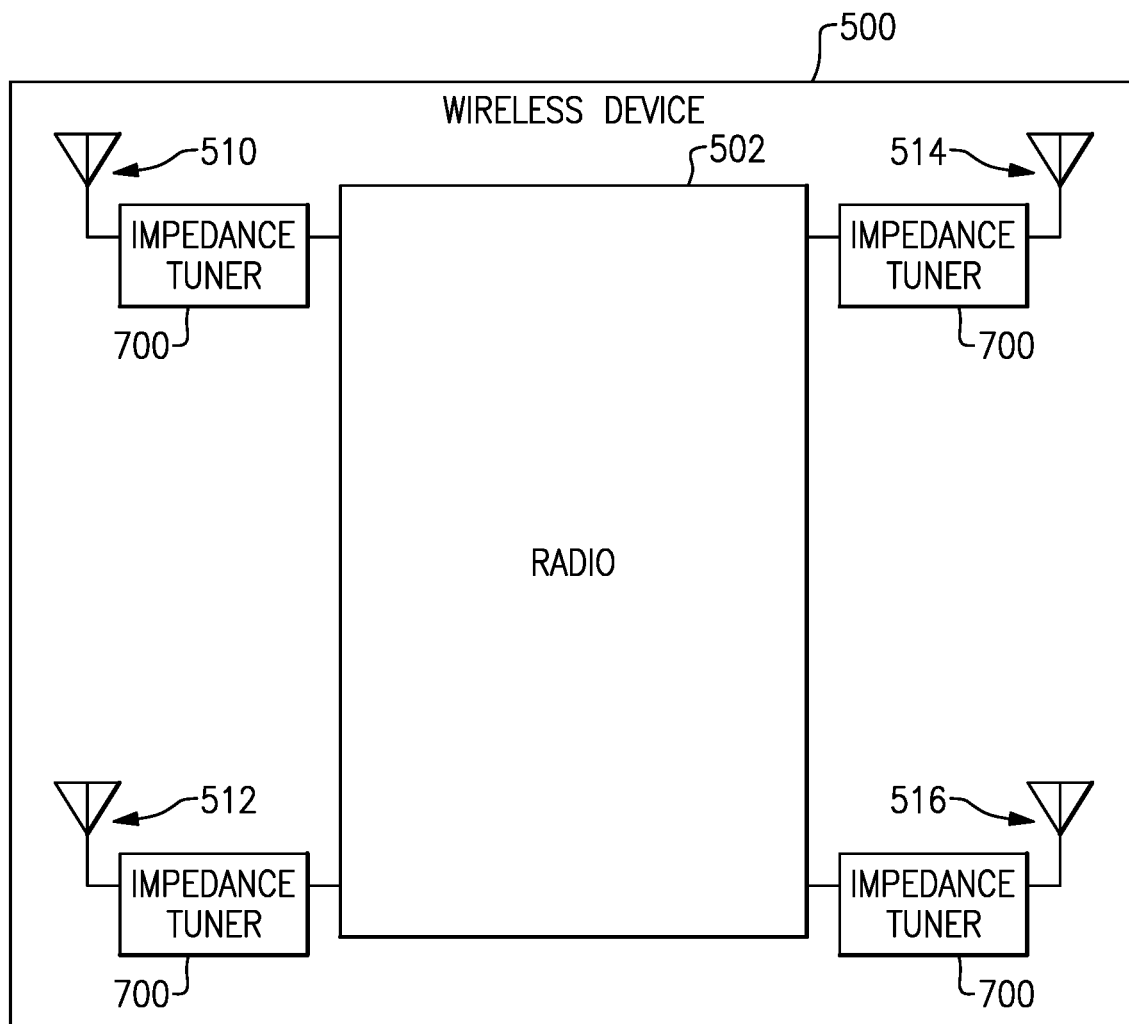
FIG. 15 shows that in some embodiments, a wireless device can include one or more impedance tuners having one or more features as described herein.

FIG. 15 shows that in some embodiments, a wireless device 500 can include one or more impedance tuners 700 having one or more features as described herein. Such a wireless device can include a radio 502 configured to provide transmit and/or receive functionalities. Such a radio can be coupled to one or more antennas, and some or all of such antenna(s) can be provided with an impedance tuner 700.

For example, in FIG. 15, the wireless device 500 is depicted as having four antenna 510, 512, 514, 516. Each of such antennas can be provided with a respective impedance tuner 700 having one or more features as described herein.

It will be understood that a wireless device can have more or less numbers of antennas. It will also be understood that in a wireless device having a plurality of antennas, not all of such antennas necessarily need to have associated impedance tuners.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An impedance tuner comprising:
a first node and a second node;
a first switchable signal path and a second switchable signal path, each switchable signal path implemented between the first node and the second node, the first switchable signal path configured to provide a capacitance without a capacitor, the second switchable signal path configured to provide an inductance;
a switchable shunt path implemented between the second node and ground; and
a switchable grounding path implemented along the second switchable signal path and configured to allow the inductance of the second switchable signal path to as be part of a series inductance path between the first and second nodes, or to allow the inductance of the second switchable signal path to be part of a shunt inductance path between the ground and a node along the second switchable signal path.

2. The impedance tuner of claim 1 wherein the switchable shunt path is a switchable inductance shunt path.

3. The impedance tuner of claim 2 wherein the impedance tuner does not include a capacitance shunt path between the second node and the ground.

4. The impedance tuner of claim 1 further comprising a third switchable signal path implemented between the first node and the second node to be electrically parallel with the first switchable signal path, the third switchable signal path configured to provide a capacitance without a capacitor.

5. The impedance tuner of claim 4 wherein the first switchable signal path, the second switchable signal path, the third switchable signal path, the switchable grounding path and the switchable shunt path configured to be capable of introducing zero, one or two elements between the first and second nodes to provide a bypass functionality or an impedance transformation functionality.

6. The impedance tuner of claim 5 wherein at least one element includes an inductance element.

7. The impedance tuner of claim 5 wherein at least one element includes a parasitic capacitance associated with a respective signal path.

8. The impedance tuner of claim 5 wherein the impedance transformation functionality includes an impedance transformation from an initial impedance to a desired impedance, the impedance transformation being one of a plurality of impedance transformations.

9. The impedance tuner of claim 8 wherein each initial impedance is within a respective impedance zone having a center impedance value on a constant voltage standing wave ratio, and the respective desired impedance includes a matched impedance.

10. The impedance tuner of claim 9 wherein the constant voltage standing wave ratio has a normalized value that is greater than or equal to 3.

11. The impedance tuner of claim 5 wherein the bypass functionality includes the first switchable signal path being conductive, and all of the other switchable signal paths, the switchable shunt path and the switchable grounding path being non-conductive.

12. The impedance tuner of claim 5 wherein the bypass functionality includes each of the first and third switchable signal paths being conductive, and the second switchable signal path, the switchable shunt path and the switchable grounding path being non-conductive, such that a parallel combination of the first and third switchable signal paths connects the first and second nodes.

13. The impedance tuner of claim 5 wherein the bypass functionality includes each of the first switchable signal path, the third switchable signal path and the second switchable signal path being conductive, and the switchable shunt path and the switchable grounding path being non-conductive.

14. The impedance tuner of claim 1 wherein the first node is a signal node for a radio circuit, and the second node is an antenna node.

15. The impedance tuner of claim 14 wherein the signal node has a matched impedance, and the antenna node is susceptible to a mismatched impedance.

* * * * *